(12) United States Patent
Fan et al.

(10) Patent No.: US 11,581,894 B2
(45) Date of Patent: Feb. 14, 2023

(54) ALTERNATIVE DATA SELECTOR, FULL ADDER AND RIPPLE CARRY ADDER

(71) Applicant: SHENZHEN MICROBT ELECTRONICS TECHNOLOGY CO., LTD., Guangdong (CN)

(72) Inventors: Zhijun Fan, Guangdong (CN); Weixin Kong, Guangdong (CN); Dong Yu, Guangdong (CN); Zuoxing Yang, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/629,153

(22) PCT Filed: May 24, 2021

(86) PCT No.: PCT/CN2021/095438
§ 371 (c)(1),
(2) Date: Jan. 21, 2022

(87) PCT Pub. No.: WO2022/001481
PCT Pub. Date: Jan. 6, 2022

(65) Prior Publication Data
US 2022/0271756 A1    Aug. 25, 2022

(30) Foreign Application Priority Data

Jun. 28, 2020 (CN) .......................... 202010596830.0
Jun. 28, 2020 (CN) .......................... 202010596855.0

(51) Int. Cl.
*H03K 19/20* (2006.01)
*G06F 7/503* (2006.01)

(52) U.S. Cl.
CPC ............ *H03K 19/20* (2013.01); *G06F 7/503* (2013.01)

(58) Field of Classification Search
CPC ............................... G06F 7/503; H03K 19/20
(Continued)

(56) References Cited

U.S. PATENT DOCUMENTS 6,505,226 B1 * 1/2003 Ahn ..................... G06F 7/501
                                                        708/707
2016/0092170 A1    3/2016 Nandi et al.
(Continued)

FOREIGN PATENT DOCUMENTS

CN       103761066 A    4/2014
CN       105471424 A    4/2016
(Continued)

OTHER PUBLICATIONS

International Search Report and Written Opinion dated Aug. 23, 2021 in International Application PCT/CN2021/095438.
(Continued)

*Primary Examiner* — Tan V Mai
(74) *Attorney, Agent, or Firm* — Venable LLP (57) ABSTRACT

Alternative data selector, a full adder, and a ripple carry adder are disclosed. The alternative data selector includes: a NOR logic circuit configured to receive a selection signal and an inverted first input and generate an intermediate result; and an AND-OR-NOT logic circuit configured to receive the selection signal, a second input, and the intermediate result of the NOR logic circuit and generate an inverted output.

14 Claims, 9 Drawing Sheets

(58) Field of Classification Search
USPC .......................................... 708/230, 700–710
See application file for complete search history.

(56) References Cited

U.S. PATENT DOCUMENTS

2016/0344391 A1* 11/2016 Fan .................... G06F 7/506
2018/0152175 A1*  5/2018 Lai .................... H03K 3/289

FOREIGN PATENT DOCUMENTS

CN    111565037 A    8/2020
CN    111625215 A    9/2020

OTHER PUBLICATIONS

Office Action dated Feb. 8, 2022 in Taiwanese Patent Application No. 110118722.

* cited by examiner

| sel | a0 | a1 | X |
|---|---|---|---|
| 0 | 1 | 1 | 1 |
|   | 1 | 0 | 1 |
|   | 0 | 1 | 0 |
|   | 0 | 0 | 0 |
| 1 | 1 | 1 | 1 |
|   | 1 | 0 | 0 |
|   | 0 | 1 | 1 |
|   | 0 | 0 | 0 |

| Input | | | Output | |
|---|---|---|---|---|
| Cin | A | B | SUM | Cout |
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

ALTERNATIVE DATA SELECTOR, FULL ADDER AND RIPPLE CARRY ADDER

CROSS-REFERENCE TO RELATED APPLICATIONS

The present application is a National Stage Entry of International Application No. PCT/CN2021/095438 filed May 24, 2021, which claims priority of Chinese Application No. 202010596855.0 filed Jun. 28, 2020, and Chinese Application No. 202010596830.0 filed Jun. 28, 2020, both of which are incorporated herein by reference in their entireties.

TECHNICAL FIELD

The present application relates to an alternative data selector, a full adder, and a ripple carry adder.

BACKGROUND

The area occupied by the data selector or the Full Adder (FA) is proportional to the number of transistors used to implement it. Therefore, as the total number of transistors decreases, the area occupied by the data selector or the full adder, also decreases. The reduction in the area of the data selector and the full adder will directly translate into a reduction in chip area and cost savings.

SUMMARY

The present disclosure provides a novel circuit implementation of an alternative data selector that can reduce the number of transistors of the alternative data selector to thereby reduce chip area. The present disclosure also provides a novel circuit implementation of a full adder that can reduce the number of transistors of the full adder to thereby reduce chip area.

According to an aspect of the present disclosure, there is provided an alternative data selector, including: a NOR logic circuit configured to receive a selection signal and an inverted first input and generate an intermediate result; and an AND-OR-NOT logic circuit configured to receive the selection signal, a second input, and the intermediate result of the NOR logic circuit and generate an inverted output.

In some embodiments, when the selection signal is logic 0, the inverted output is an inverted first input, and when the selection signal is logic 1, the inverted output is an inverted second input.

In some embodiments, the NOR logic circuit comprises: a first PMOS transistor whose gate terminal is configured to receive a selection signal, wherein a source terminal of the first PMOS transistor is coupled to a power supply terminal; a second PMOS transistor whose gate terminal is configured to receive the inverted first input, whose source terminal is coupled to a drain terminal of the first PMOS transistor, and whose drain terminal is coupled to a first node; a first NMOS transistor whose gate terminal is configured to receive the selection signal and whose drain terminal is coupled to the first node; and a second NMOS transistor whose gate terminal is configured to receive the inverted first input and whose drain terminal is coupled to the first node, wherein a source terminal of each of the first NMOS transistor and the second NMOS transistor is coupled to a ground terminal, wherein the NOR logic circuit is configured to generate the intermediate result at the first node.

In some embodiments, the AND-OR-NOT logic circuit includes: a third PMOS transistor whose gate terminal is configured to receive the intermediate result of the NOR logic circuit, wherein a source terminal of the third PMOS transistor is coupled to the power supply terminal; a fourth PMOS transistor whose gate terminal is configured to receive the selection signal, whose source terminal is coupled to a drain terminal of the third PMOS transistor, and whose drain terminal is coupled to a second node; a fifth PMOS transistor whose gate terminal is configured to receive the second input, whose source terminal is coupled to the drain terminal of the third PMOS transistor, and whose drain terminal is coupled to the second node; a third NMOS transistor whose gate terminal is configured to receive the intermediate result of the NOR logic circuit and whose drain terminal is coupled to the second node; a fourth NMOS transistor whose gate terminal is configured to receive the selection signal and whose drain terminal is coupled to the second node; and a fifth NMOS transistor whose gate terminal is configured to receive the second input and whose drain terminal is coupled to a source terminal of the fourth NMOS transistor, wherein a source terminal of each of the third NMOS transistor and the fifth NMOS transistor is coupled to the ground terminal, wherein the AND-OR-NOT logic circuit is configured to generate the inverted output at the second node.

According to another aspect of the present disclosure, there is provided a full adder including: a NAND logic circuit configured to receive a first input and a second input and generate a first intermediate result; an OR-AND-NOT logic circuit configured to receive the first input, the second input, and the first intermediate result of the NAND logic circuit, and generate a second intermediate result; a first NOR logic circuit configured to receive the second intermediate result of the OR-AND-NOT logic circuit and a third input and generate a third intermediate result; an AND-OR-NOT logic circuit configured to receive the second intermediate result of the OR-AND-NOT logic circuit, the third input, and the third intermediate result of the first NOR logic circuit, and generate a first output; and a carry generation circuit configured to receive the first intermediate result of the NAND logic circuit and the third intermediate result of the first NOR logic circuit, and generate a second output.

In some embodiments, in the case where the first input is a non-inverted addend, the second input is a non-inverted summand, the third input is an inverted carry from a lower bit, the first output is a non-inverted remainder and the second output is an inverted carry.

In some embodiments, the NAND logic circuit includes: a first PMOS transistor whose gate terminal is configured to receive the first input and whose drain terminal is coupled to a first node; a second PMOS transistor whose gate terminal is configured to receive the second input and whose drain terminal is coupled to the first node, wherein a source terminal of each of the first PMOS transistor and the second PMOS transistor is coupled to a power supply terminal; a first NMOS transistor whose gate terminal is configured to receive the first input and whose drain terminal is coupled to the first node; and a second NMOS transistor whose gate terminal is configured to receive the second input and whose drain terminal is coupled to a source terminal of the first NMOS transistor, wherein a source terminal of the second NMOS transistor is coupled to a ground terminal, wherein the NAND logic circuit is configured to generate the first intermediate result at the first node.

In some embodiments, the OR-AND-NOT logic circuit comprises: a third PMOS transistor whose gate terminal is configured to receive the first intermediate result of the NAND logic circuit and whose drain terminal is coupled to a second node; a fourth PMOS transistor whose gate terminal is configured to receive the first input, wherein a source terminal of each of the third PMOS transistor and the fourth PMOS transistor is coupled to the power supply terminal; a fifth PMOS transistor whose gate terminal is configured to receive the second input, whose source terminal is coupled to a drain terminal of the fourth PMOS transistor, and whose drain terminal is coupled to the second node; a third NMOS transistor whose gate terminal is configured to receive the first intermediate result of the NAND logic circuit and whose drain terminal is coupled to the second node; a fourth NMOS transistor whose gate terminal is configured to receive the first input and whose drain terminal is coupled to a source terminal of the third NMOS transistor; and a fifth NMOS transistor whose gate terminal is configured to receive the second input and whose drain terminal is coupled to the source terminal of the third NMOS transistor, wherein a source terminal of each of the fourth NMOS transistor and the fifth NMOS transistor is coupled to the ground terminal, wherein the OR-AND-NOT logic circuit is configured to generate the second intermediate result at the second node.

In some embodiments, the first NOR logic circuit comprises: a sixth PMOS transistor whose gate terminal is configured to receive the second intermediate result of the OR-AND-NOT logic circuit, wherein a source terminal of the sixth PMOS transistor is coupled to the power supply terminal; a seventh PMOS transistor whose gate terminal is configured to receive the third input, whose source terminal is coupled to a drain terminal of the sixth PMOS transistor, and whose drain terminal is coupled to a third node; a sixth NMOS transistor whose gate terminal is configured to receive the second intermediate result of the OR-AND-NOT logic circuit and whose drain terminal is coupled to the third node; and a seventh NMOS transistor whose gate terminal is configured to receive the third input and whose drain terminal is coupled to the third node, wherein a source terminal of each of the sixth NMOS transistor and the seventh NMOS transistor is coupled to the ground terminal, wherein the first NOR logic circuit is configured to generate the third intermediate result at the third node.

In some embodiments, the AND-OR-NOT logic circuit includes: an eighth PMOS transistor whose gate terminal is configured to receive the third intermediate result of the first NOR logic circuit, wherein a source terminal of the eighth PMOS transistor is coupled to the power supply terminal; a ninth PMOS transistor whose gate terminal is configured to receive the second intermediate result of the OR-AND-NOT logic circuit, whose source terminal is coupled to a drain terminal of the eighth PMOS transistor, and whose drain terminal is coupled to a fourth node; a tenth PMOS transistor whose gate terminal is configured to receive the third input, whose source terminal is coupled to the drain terminal of the eighth PMOS transistor, and whose drain terminal is coupled to the fourth node; an eighth NMOS transistor whose gate terminal is configured to receive the third intermediate result of the first NOR logic circuit and whose drain terminal is coupled to the fourth node; a ninth NMOS transistor whose gate terminal is configured to receive the second intermediate result of the OR-AND-NOT logic circuit and whose drain terminal is coupled to the fourth node; and a tenth NMOS transistor whose gate terminal is configured to receive the third input and whose drain terminal is coupled to a source terminal of the ninth NMOS transistor, wherein a source terminal of each of the eighth NMOS transistor and the tenth NMOS transistor is coupled to the ground terminal, wherein the AND-OR-NOT logic circuit is configured to generate the first output at the fourth node.

In some embodiments, the carry generation circuit includes an inverter configured to receive the first intermediate result of the NAND logic circuit and generate a fourth intermediate result, and a second NOR logic circuit configured to receive the fourth intermediate result of the inverter and the third intermediate result of the first NOR logic circuit and generate the second output.

In some embodiments, the inverter comprises: an eleventh PMOS transistor whose gate terminal is configured to receive the first intermediate result of the NAND logic circuit and whose drain terminal is coupled to a fifth node, wherein a source terminal of the eleventh PMOS transistor is coupled to the power supply terminal; and an eleventh NMOS transistor whose gate terminal is configured to receive the first intermediate result of the NAND logic circuit and whose drain terminal is coupled to the fifth node, wherein a source terminal of the eleventh NMOS transistor is coupled to the ground terminal, wherein the inverter is configured to generate the fourth intermediate result at the fifth node.

In some embodiments, the second NOR logic circuit comprises: a twelfth PMOS transistor whose gate terminal is configured to receive the fourth intermediate result of the inverter, wherein a source terminal of the twelfth PMOS transistor is coupled to the power supply terminal; a thirteenth PMOS transistor whose gate terminal is configured to receive the third intermediate result of the first NOR logic circuit, whose source terminal is coupled to a drain terminal of the twelfth PMOS transistor, and whose drain terminal is coupled to a sixth node; a twelfth NMOS transistor whose gate terminal is configured to receive the fourth intermediate result of the inverter and whose drain terminal is coupled to the sixth node; and a thirteenth NMOS transistor whose gate terminal is configured to receive the output of the NOR logic circuit and whose drain terminal is coupled to the sixth node, wherein a source terminal of each of the twelfth NMOS transistor and the thirteenth NMOS transistor is coupled to the ground terminal, wherein the second NOR logic circuit is configured to generate the second output at the sixth node.

According to yet another aspect of the present disclosure, there is provided a ripple carry adder comprising a plurality of cascaded full adders of the present disclosure.

BRIEF DESCRIPTION OF THE DRAWINGS

A better understanding of the present disclosure may be obtained when the following detailed description of the embodiments is considered in conjunction with the following drawings. The same or similar reference numbers are used throughout the drawings to refer to the same or like parts. The accompanying drawings together with the detailed description below are incorporated in and form a part of the specification, illustrate embodiments of the present disclosure and serve to explain the principles and advantages of the present disclosure.

DETAILED DESCRIPTION

The following detailed description of embodiments presents various details of specific embodiments of the present disclosure. However, the present disclosure can be implemented in many different ways as defined and covered by the claims. In this specification, the same reference signs may indicate the same or functionally similar elements.

Figure 1:
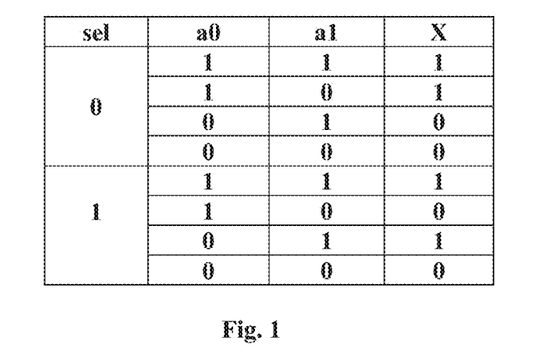
FIG. 1 shows a truth table for an alternative data selector.
Figure 2:
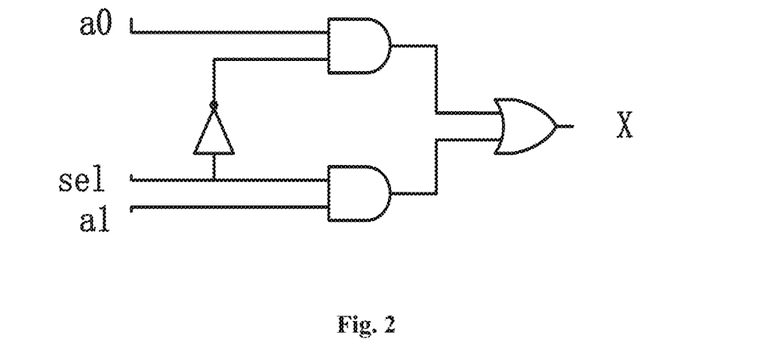
FIG. 2 shows a logic diagram of an alternative data selector.

The data selector is a device which transmits data of a plurality of channels to a unique common data channel through selection to realize a data selection function. The logical expression of the alternative data selector is X=$\overline{sel} \cdot a0 + sel \cdot a1$. Sel is a selection signal, a0 is a first input, a1 is a second input. FIG. 1 shows a truth table of an alternative data selector, and FIG. 2 shows a logic diagram of an alternative data selector. When the selection signal sel is logic 0, the output X is the first input a0. When the selection signal sel is logic 1, the output X is the second input a1.

Figure 3:
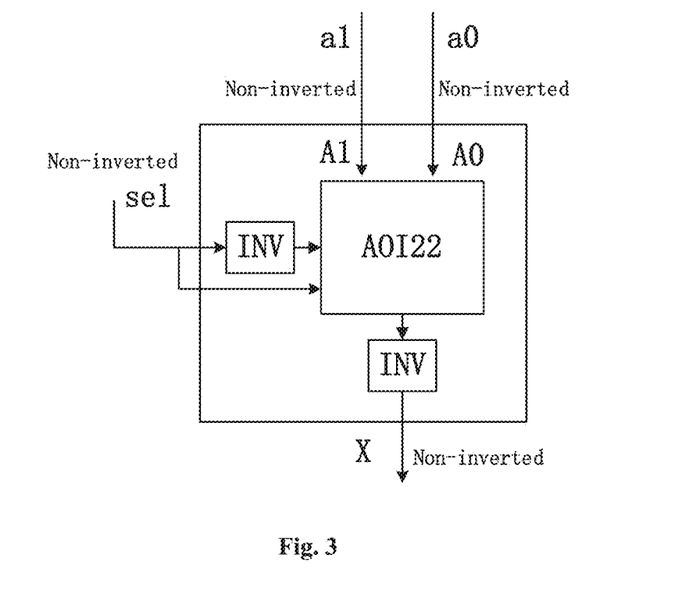
FIG. 3 shows a structural block diagram of a MUX2 alternative data selector.

FIG. 3 shows a structural block diagram of a MUX2 alternative data selector. As shown in FIG. 3, the MUX2 alternative data selector includes one AOI22 logic circuit and two inverter INV logic circuits. The input terminal A0 receives a first input a0, and the input terminal A1 receives a second input a1. The output of the AOI22 logic circuit is $\overline{sel \cdot a0 + sel \cdot a1}$. Therefore, the output of MUX2 alternative data selector is X=$\overline{\overline{sel} \cdot a0 + sel \cdot a1}$=sel?a1:a0. The MUX2 alternative data selector occupies a large chip area, and has large time delay and low speed.

Figure 4:
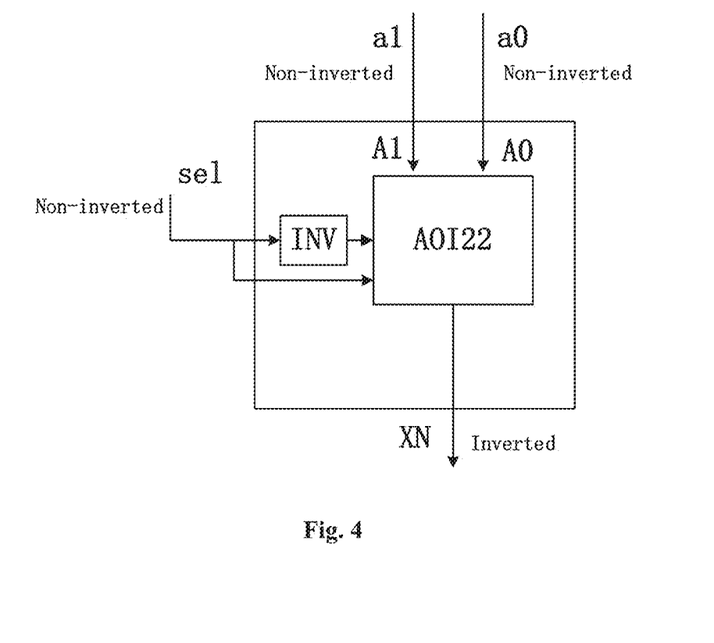
FIG. 4 shows a structural block diagram of a MUXI2 alternative data selector.

FIG. 4 shows a structural block diagram of a MUXI2 alternative data selector. As shown in FIG. 4, the MUXI2 alternative data selector includes one AOI22 logic circuit and one inverter INV logic circuit. The input terminal A0 receives a first input a0, and the input terminal A1 receives a second input a1, and the output XN=$\overline{sel?a1:a0}$ is the inverse of the output X in FIG. 3. The delay of the MUXI2 alternative data selector is small, but the chip area occupied is still large in some cases.

Figure 5:
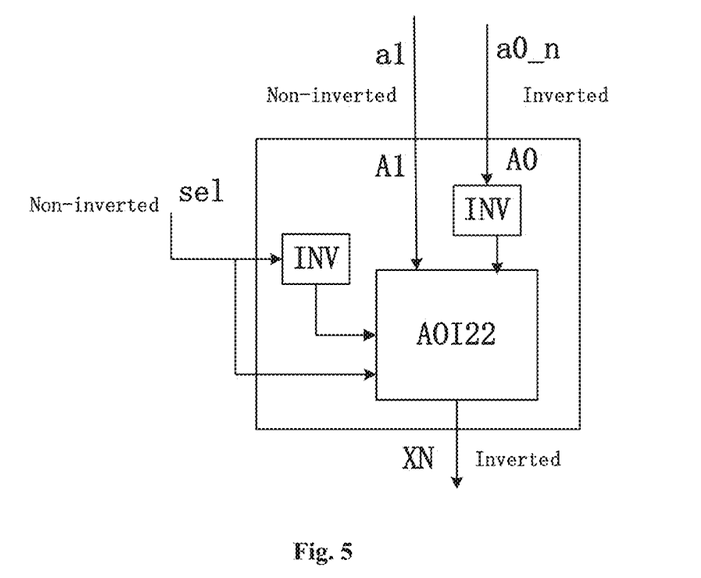
FIG. 5 shows a structural block diagram of an alternative data selector in which one input is inverted.

FIG. 5 shows a structural block diagram of an alternative data selector in which one input is inverted. As shown in FIG. 5, the alternative data selector includes one AOI22 logic circuit and two inverter INV logic circuits. The input terminal A0 receives an inverted first input a0_$n$ (i.e., the inverse of a0), and the input terminal A1 receives a second input a1, and the output XN=$\overline{sel?a1:a0}$ is the inverse of the output X in FIG. 3. The alternative data selector also has the defect of large occupied chip area, large time delay and low speed.

For a CMOS circuit, its output naturally is inverted based on the operating principle. If a non-inverted output is to be realized, an inverter needs to be added after the natural output. The present disclosure takes advantage of this characteristic of CMOS circuits to provide a novel circuit implementation of an alternative data selector. In contrast to the related art described above, the alternative data selector of the present disclosure does not require the use of an additional inverter. Advantageously, reducing the number of additional inverters can reduce the corresponding number of transistors and thus save chip area. In addition, the present disclosure can reduce the relative time delay between the internal signals of the circuit introduced by using the inverter, thereby improving the glitch in the output signal. In addition, the alternative data selector of the present disclosure uses a logic circuit having fewer input terminals than the related art described above. Such a logic circuit can be driven more easily.

Figure 6:
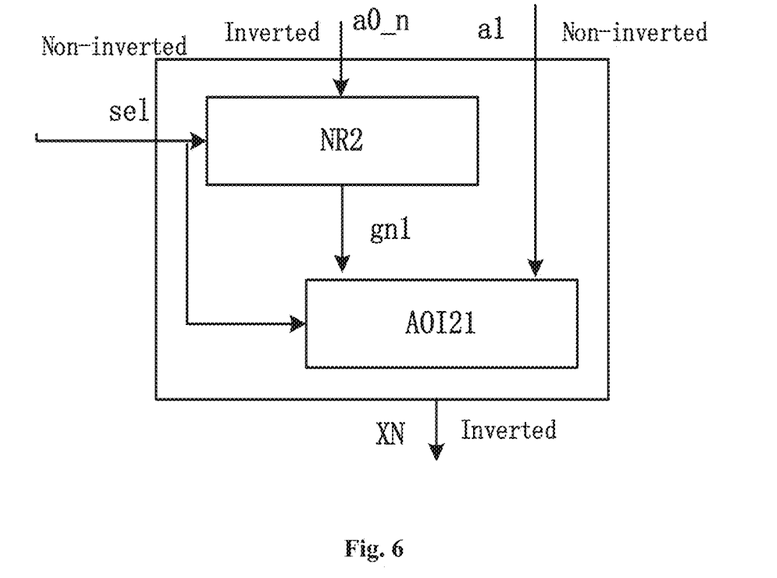
FIG. 6 shows a structural block diagram of an alternative data selector of an embodiment of the present disclosure.

FIG. 6 shows a structural block diagram of an alternative data selector of an embodiment of the present disclosure. The alternative data selector in FIG. 6 includes a NOR logic circuit NR2 and an AND-OR-NOT logic circuit AOI21.

The NOR logic circuit NR2 is configured to receive a selection signal sel and an inverted first input a0_$n$ and generate an intermediate result gn1=$\overline{sel+a0\_n}$. The AND-OR-NOT logic circuit AOI21 is configured to receive the selection signal sel, a second input a1, and the intermediate result gn1 of the NOR logic circuit, and to generate an inverted output XN=$\overline{(sel \cdot a1)+gn1}$.

The inverted first input a0_$n$ is the inverse of the first input a0, i.e., a0_$n$=$\overline{a0}$. Further, XN=$\overline{(sel \cdot a1)+\overline{sel+a0\_n}}$=$\overline{(sel \cdot a1)+(\overline{sel} \cdot a0)}$=$\overline{sel?a1:a0}$ can be obtained. That is, XN=$\overline{X}$, i.e., XN is the inverse of the output X.

Therefore, in the case where the selection signal sel is logic 0, the inverted output XN is the inverted first input a0_$n$=$\overline{a0}$. In the case where the selection signal sel is logic 1, the inverted output XN is the inverted second input $\overline{a1}$.

Figure 7:
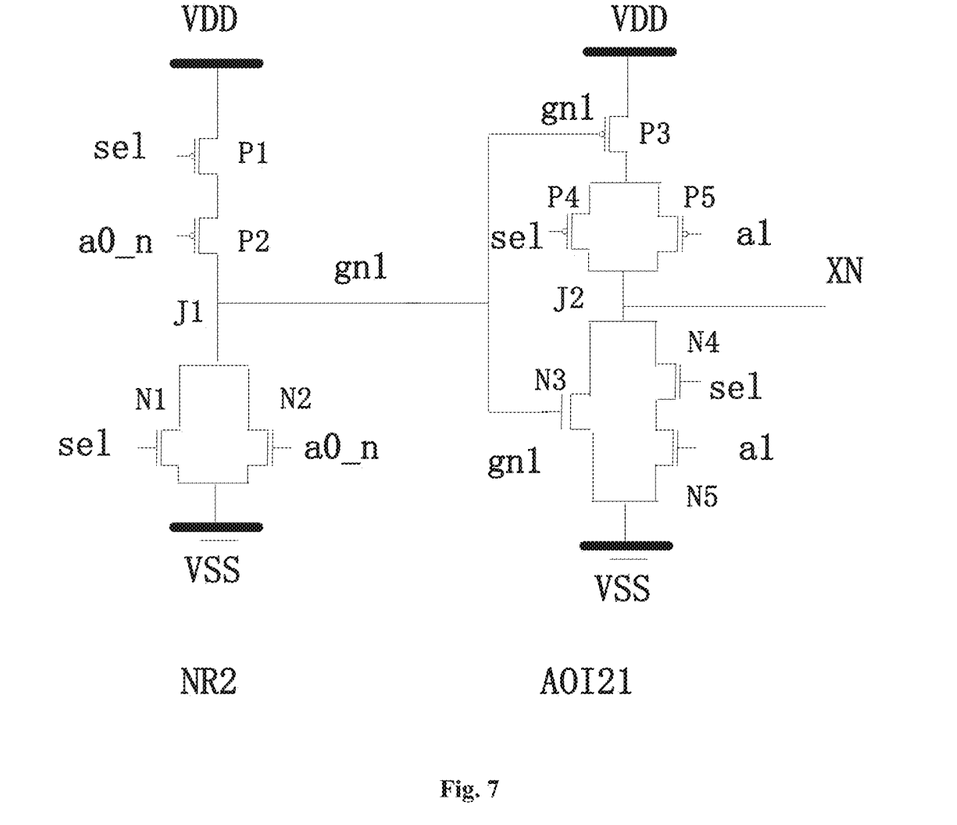
FIG. 7 shows a CMOS circuit diagram of an alternative data selector of an embodiment of the present disclosure.

FIG. 7 shows a CMOS circuit diagram of an alternative data selector of an embodiment of the present disclosure.

As shown in FIG. 7, the NOR logic circuit NR2 includes a first PMOS transistor P1, a second PMOS transistor P2, a first NMOS transistor N1, and a second NMOS transistor N2. A gate terminal of the first PMOS transistor P1 is configured to receive a selection signal sel. A source terminal of the first PMOS transistor P1 is coupled to a power supply terminal VDD. The second PMOS transistor P2 has a gate terminal configured to receive an inverted first input a0_$n$, a source terminal being coupled to a drain terminal of the first PMOS transistor, and a drain terminal coupled to a first node J1. The first NMOS transistor N1 has a gate terminal configured to receive the selection signal sel and a drain terminal coupled to the first node J1. The second NMOS transistor N2 has a gate terminal configured to receive the inverted first input a0_N and a drain terminal coupled to the first node J1. A source terminal of each of the first NMOS transistor N1 and the second NMOS transistor N2 is coupled to a ground terminal VSS. The NOR logic circuit NR2 is configured to generate a intermediate result gn1 at the first node J1.

The AND-OR-NOT logic circuit AOI21 includes a third PMOS transistor P3, a fourth PMOS transistor P4, a fifth PMOS transistor P5, a third NMOS transistor N3, a fourth NMOS transistor N4, and a fifth NMOS transistor N5. A gate terminal of the third PMOS transistor P3 is configured to receive the intermediate result gn1 of the NOR logic circuit. A source terminal of the third PMOS transistor P3 is coupled to the power supply terminal VDD. The fourth PMOS transistor P4 has a gate terminal configured to receive the selection signal sel, a source terminal coupled to a drain terminal of the third PMOS transistor, and a drain terminal coupled to a second node J2. The fifth PMOS transistor P5 has a gate terminal configured to receive the second input a1, a source terminal coupled to the drain terminal of the third PMOS transistor P3, and a drain terminal coupled to the second node J2. The third NMOS transistor N3 has a gate terminal configured to receive the intermediate result gn1 of the NOR logic circuit and a drain terminal coupled to the second node J2. The fourth NMOS transistor N4 has a gate terminal configured to receive the selection signal sel and a drain terminal coupled to the second node J2. The fifth NMOS transistor N5 has a gate terminal configured to receive the second input a1 and a drain terminal coupled to a source terminal of the fourth NMOS transistor N4. A source terminal of each of the third NMOS transistor N3 and the fifth NMOS transistor N5 is coupled to the ground terminal VSS. The AND-OR-NOT logic circuit AOI21 is configured to generate an inverted output XN at the second node J2.

The alternative data selector of the embodiment of the present disclosure is composed by a NOR logic circuit NR2 and an AND-OR-NOT logic circuit AOI21. The whole circuit does not need an inverter, so that the use of transistors is reduced, the chip area is further saved, and the relative time delay among signals in the circuit is reduced, thereby improving the glitch in the output signal. In addition, the logic circuit has fewer input terminals and is easier to drive.

The alternative data selector of the present disclosure is described above in conjunction with specific embodiments. However, it should be understood that any feature of any one embodiment may be combined with and/or replaced with any other feature of any other embodiment.

Figure 8:
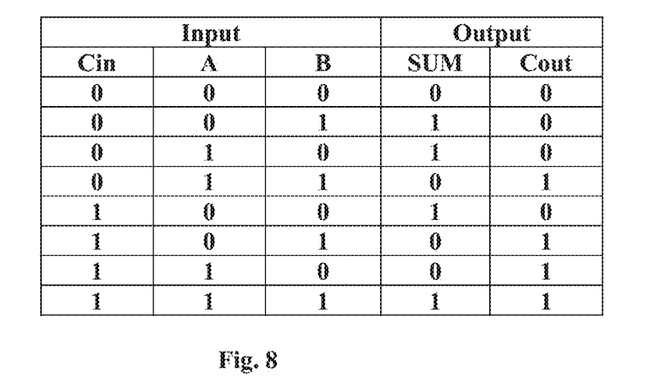
FIG. 8 shows a truth table of a full adder.

FIG. 8 shows a truth table of a full adder. The full adder adds three 1-bit numbers, namely an addend A, a summand B and a carry Cin from a lower bit, to obtain two outputs, namely a carry Cout and a remainder SUM.

Figure 9:
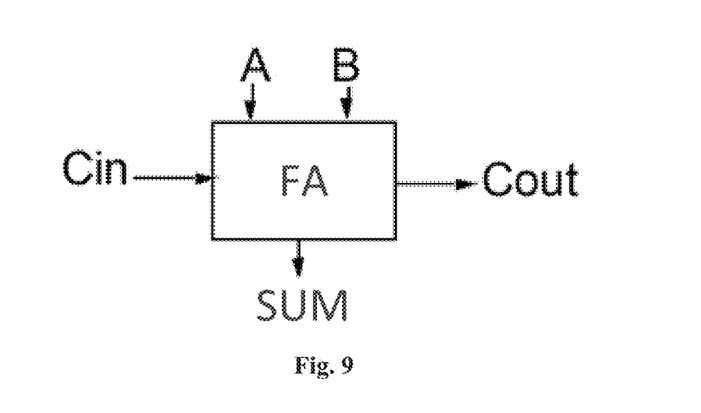
FIG. 9 shows a logic diagram of a full adder.

FIG. 9 shows a logic diagram of a full adder. In FIG. 9, the logical relationship between the remainder SUM and the addend A, the summand B, and the carry Cin from the lower bit is SUM=A⊕B⊕Cin. The logical relationship between the carry Cout and the addend A, the summand B, and the carry Cin from the lower bit is Cout=AB+Cin (A+B).

Figure 10A:
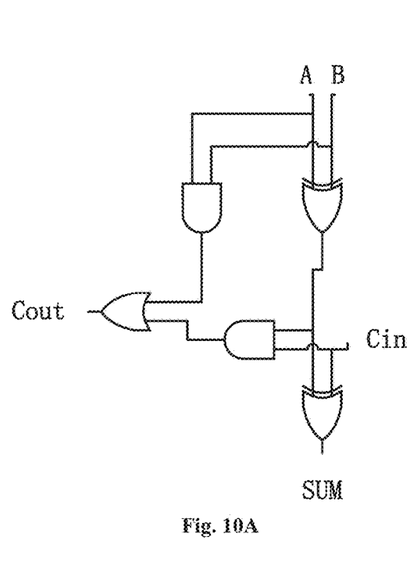
FIG. 10A and FIG. 10B show a standard CMOS implementation and a multiplex implementation of a full adder, respectively.
Figure 10B:
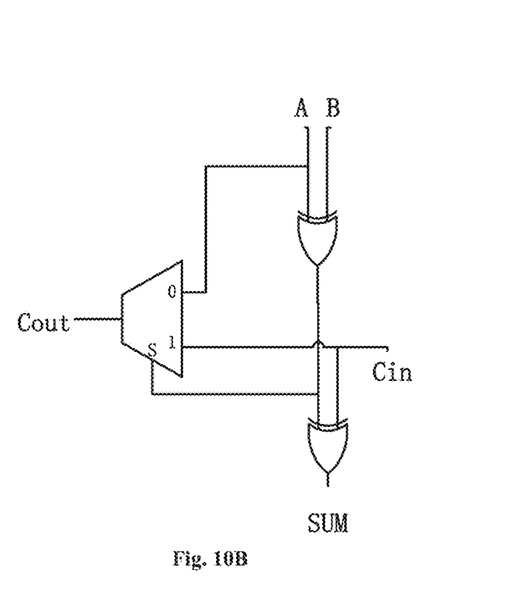

FIG. 10A and FIG. 10B show a standard CMOS implementation and a multiplex implementation of the full adder, respectively. In FIGS. 10A and 10B, the ways to calculate the remainder SUM are both SUM=A⊕B⊕Cin, and the difference is the way to calculate the carry Cout. In FIG. 10A, Cout=AB+Cin (A⊕B). In FIG. 10B, Cout=(A⊕B)? Cin: a, i.e., when A⊕B=1, Cout=Cin; when A⊕B=0, Cout=a.

Figure 11:
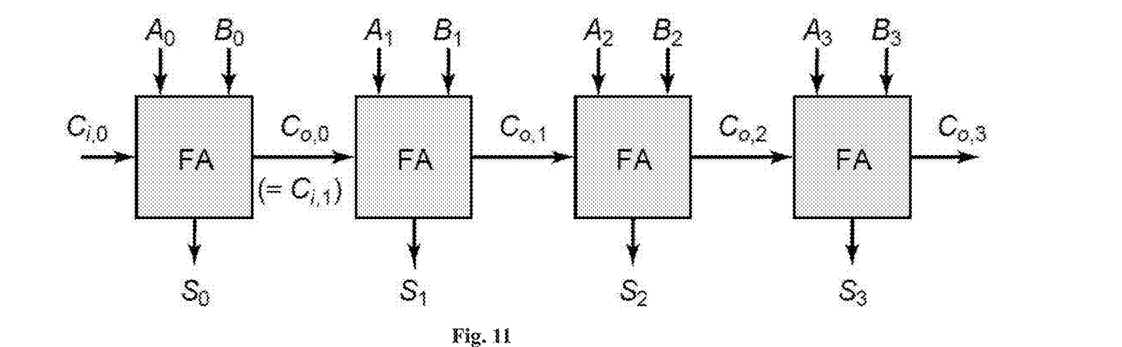
FIG. 11 shows a structure of a ripple carry adder.

Ripple Carry Adder can be conveniently implemented by using full adder, i.e. through cascading multiple full adders. FIG. 11 shows a structure of a ripple carry adder. The ripple carry adder is formed by connecting N full adders in series. The carry $C_{o,i}$ of the i-th stage full adder is used to generate the remainder $S_i$ and the carry $C_{o,i+1}$ of the (i+1)-th stage. The ripple carry adder has the characteristics of intuitive and simple structure and low running speed.

One requirement for the ripple carry adder is that the sign bits of the full adder are self-consistent, i.e. the signs of the input Cin and output Cout of the full adder are consistent. Transfer can only be achieved when the sign of the input Cin of the full adder is consistent with the sign of the output Cout.

However, for a circuit implemented with CMOS, its natural output is inverted. If a non-inverted output is to be realized, an inverter needs to be added after the natural output. For example, for a full adder implemented with CMOS, if the previous stage full adder does not add an inverter, it outputs an inverted carry. However, in the related art, the full adder requires input of a non-inverted carry. Thus, it is necessary to add an inverter between the previous stage full adder and the current stage full adder to make the sign (or phase) of the carry outputted from the previous stage full adder consistent with the sign (or phase) of the carry required by the current stage full adder. However, adding additional inverters in each full adder will result in increased chip area and power consumption.

Figure 12:
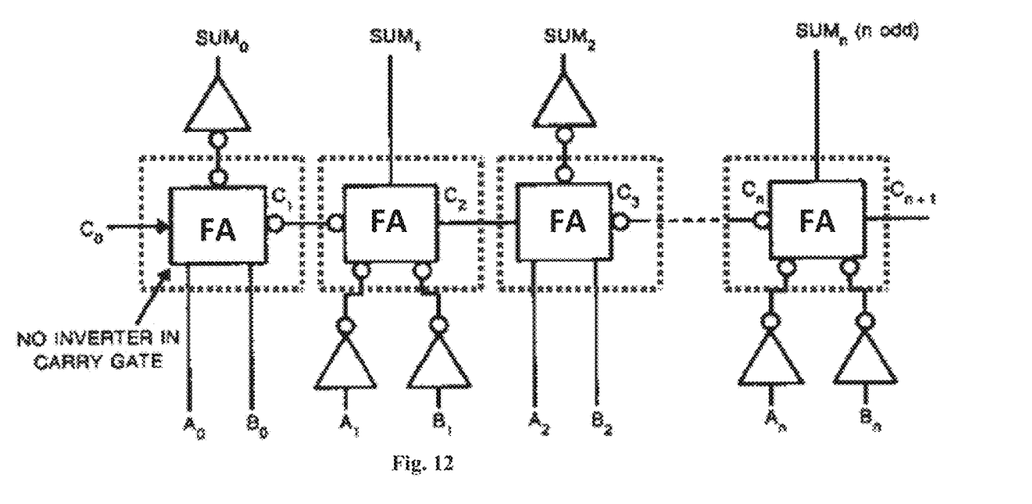
FIG. 12 shows a full adder that changes the input sign bit in order to make the area of the full adder smaller.

FIG. 12 shows a full adder that changes the input sign bit in order to make the area of the full adder smaller. However, the sign bits of the odd-stage full adders and the even-stage full adders in FIG. 12 are not consistent. Odd-stage full adders require that the input addend and summand be inverted. That is, an inverter needs to be added to the input of the odd-stage full adder to change the sign of the input addend and summand. That is, although the solution in FIG. 12 avoids adding an inverter in the full adder, it requires adding an inverter outside the full adder, which also increases the area of the whole chip.

The present disclosure provides a novel circuit implementation of a full adder that can reduce the number of transistors of the full adder to thereby reduce chip area.

Figure 13:
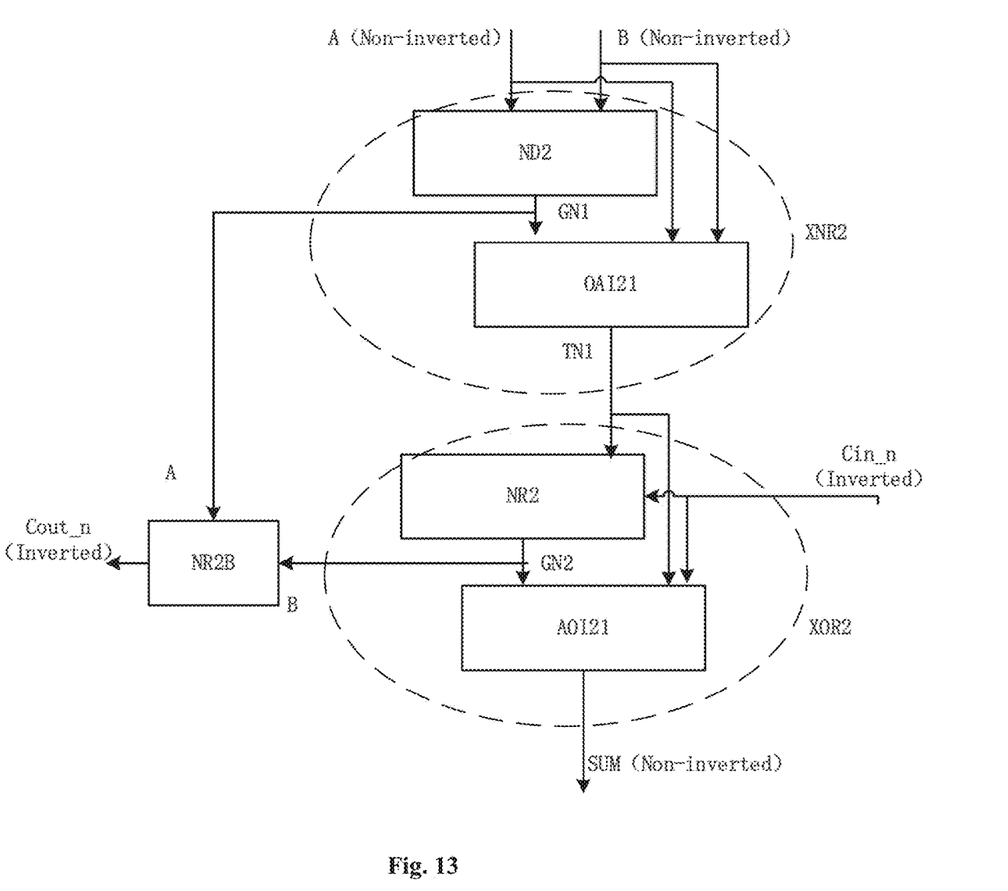
FIG. 13 shows a logic diagram of a full adder of an embodiment of the present disclosure.

FIG. 13 shows a logic diagram of a full adder of an embodiment of the present disclosure. The full adder in FIG. 13 includes a NAND logic circuit ND2, an OR-AND-NOT logic circuit OAI21, a first NOR logic circuit NR2, an AND-OR-NOT logic circuit AOI21, and a carry generation circuit NR2B.

The NAND logic circuit ND2 is configured to receive a first input A and a second input B and generate a first intermediate result GN1=$\overline{AB}$. The OR-AND-NOT logic circuit OAI21 is configured to receive the first input A, the second input B and the first intermediate result GN1 of the NAND logic circuit and to generate a second intermediate result TN1=$\overline{(A+B)GN1}$.

Since TN1=$\overline{(A+B)GN1}$=$\overline{(A+B)\overline{AB}}$=A⊕A, the NAND logic circuit ND2 and the OR-AND-NOT logic circuit OAI21 actually constitute an XNOR logic circuit XNR2.

The first NOR logic circuit NR2 is configured to receive the second intermediate result TN1 of the OR-AND-NOT logic circuit OAI21 and a third input Cin_n, and generate a third intermediate result GN2=$\overline{TN1+Cin\_n}$. The AND-OR-NOT logic circuit AOI21 is configured to receive the second intermediate result TN1 of the OR-AND-NOT logic circuit, the third input Cin_n, and the third intermediate result GN2 of the first NOR logic circuit, and generate an output SUM=$\overline{(TN1·Cin\_n)+GN2}$.

Further, SUM=$\overline{(TN1·Cin\_n)+GN2}$=$\overline{(TN1·Cin\_n)+\overline{TN1+Cin\_n}}$=TN1⊕Cin_n can be obtained, so that the first NOR logic circuit NR2 and the AND-OR-NOT logic circuit AOI21 actually constitute an XOR logic circuit XOR2.

The carry generation circuit NR2B is configured to receive the first intermediate result GN1 of the NAND logic circuit and the third intermediate result GN2 of the first NOR logic circuit, and generate an inverted carry Cout_n=$\overline{GN1+GN2}$.

When the first input A is a non-inverted addend, the second input B is a non-inverted summand, and the third input Cin_n is an inverted carry from a lower bit, Cin=

$\overline{\text{Cin\_n}}$. The first output SUM=TN1⊕Cin_n=$\overline{\text{A⊕B⊕}}$ $\overline{\text{Cin\_n}}$=A⊕B⊕Cin. That is, the first output SUM is a non-inverted remainder.

The second output Cout_n=$\overline{\overline{\text{GN1}}+\text{GN2}}$=GN1·$\overline{\text{GN2}}$= $\overline{\text{AB}}$·(TN1+Cin_n)=$\overline{\text{AB}}$·$\overline{(\text{A⊕A}+\text{Cin\_n})}$=$\overline{\text{AB}+(\text{A⊕B·Cin\_n})}$= $\overline{\text{AB}+(\text{A⊕A·Cin\_n})}$. That is, the second output Cout_n is an inverted carry.

It can be seen that the input Cin_n and the output Cout_n of the full adder are inverted, so that the logic self-consistency of the full adder is realized. Although inputs A and B are both non-inverted, they are opposite to the signs of Cin_n and Cout_n. However, Cin_n and Cout_n are internal signals, and have no influence on the external circuit configuration.

Figure 14:
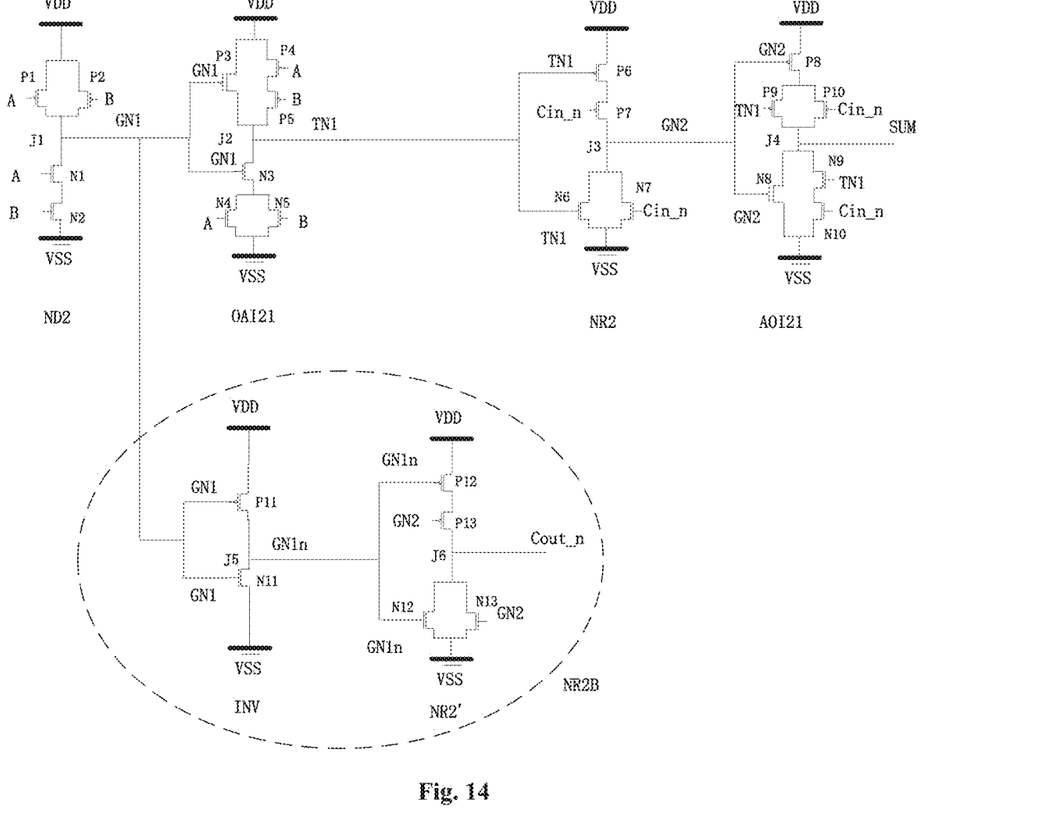
FIG. 14 shows a CMOS structural diagram of a full adder of an embodiment of the present disclosure.

FIG. 14 shows a CMOS structural diagram of a full adder of an embodiment of the present disclosure.

As shown in FIG. 14, the NAND logic circuit ND2 includes a first PMOS transistor P1, a second PMOS transistor P2, a first NMOS transistor N1, and a second NMOS transistor N2. A gate terminal of the first PMOS transistor P1 is configured to receive a first input A and a drain terminal of the first PMOS transistor P1 is coupled to a first node J1. The second PMOS transistor P2 has a gate terminal configured to receive a second input B and a drain terminal coupled to the first node J1. A source terminal of each of the first PMOS transistor P1 and the second PMOS transistor P2 is coupled to a power supply terminal VDD. The first NMOS transistor has a gate terminal configured to receive the first input A and a drain terminal coupled to the first node J1. The second NMOS transistor has a gate terminal configured to receive the second input B and a drain terminal coupled to a source terminal of the first NMOS transistor. A source terminal of the second NMOS transistor is coupled to a ground terminal VSS. The NAND logic circuit ND2 is configured to generate a first intermediate result GN1 at the first node J1.

The OR-AND-NOT logic circuit OAI21 includes a third PMOS transistor P3, a fourth PMOS transistor P4, a fifth PMOS transistor P5, a third NMOS transistor N3, a fourth NMOS transistor N4, and a fifth NMOS transistor N5. The third PMOS transistor P3 has a gate terminal configured to receive the first intermediate result GN1 of the NAND logic circuit and a drain terminal coupled to the second node J2. A gate terminal of the fourth PMOS transistor P4 is configured to receive the first input A. A source terminal of each of the third PMOS transistor and the fourth PMOS transistor is coupled to the power supply terminal VDD. The fifth PMOS transistor P5 has a gate terminal configured to receive the second input B, a source terminal coupled to a drain terminal of the fourth PMOS transistor, and a drain terminal coupled to the second node J2. The third NMOS transistor N3 has a gate terminal configured to receive the first intermediate result GN1 of the NAND logic circuit, and a drain terminal coupled to the second node J2. The fourth NMOS transistor N4 has a gate terminal of configured to receive the first input A, and a drain terminal coupled to a source terminal of the third NMOS transistor. The fifth NMOS transistor N5 has a gate terminal configured to receive the second input B, and a drain terminal coupled to the source terminal of the third NMOS transistor. A source terminal of each of the fourth NMOS transistor and the fifth NMOS transistor is coupled to the ground terminal VSS. The OR-AND-NOT logic circuit OAI21 is configured to generate a second intermediate result TN1 at the second node J2.

The first NOR logic circuit NR2 includes a sixth PMOS transistor P6, a seventh PMOS transistor P7, a sixth NMOS transistor N6, and a seventh NMOS transistor N7. A gate terminal of the sixth PMOS transistor P6 is configured to receive the second intermediate result TN1 of the OR-AND-NOT logic circuit OAI21. A source terminal of the sixth PMOS transistor is coupled to the power supply terminal VDD. The seventh PMOS transistor P7 has a gate terminal configured to receive a third input Cin_n, a source terminal coupled to a drain terminal of the sixth PMOS transistor, and a drain terminal coupled to a third node J3. The sixth NMOS transistor N6 has a gate terminal configured to receive the second intermediate result TN1 of the OR-AND-NOT logic circuit OAI21 and a drain terminal coupled to the third node J3. The seventh NMOS transistor N7 has a gate terminal configured to receive the third input Cin_N and a drain terminal coupled to the third node J3. A source terminal of each of the sixth NMOS transistor and the seventh NMOS transistor is coupled to the ground terminal VSS. The first NOR logic circuit NR2 is configured to generate a third intermediate result GN2 at the third node J3.

The AND-OR-NOT logic circuit AOI21 includes an eighth PMOS transistor P8, a ninth PMOS transistor P9, a tenth PMOS transistor P10, an eighth NMOS transistor N8, a ninth NMOS transistor N9, and a tenth NMOS transistor N10. A gate terminal of the eighth PMOS transistor P8 is configured to receive the third intermediate result GN2 of the first NOR logic circuit. A source terminal of the eighth PMOS transistor is coupled to the power supply terminal VDD. The ninth PMOS transistor P9 has a gate terminal configured to receive the second intermediate result TN1 of the OR-AND-NOT logic circuit, a source terminal coupled to a drain terminal of the eighth PMOS transistor, and a drain terminal coupled to a fourth node J4. The tenth PMOS transistor P10 has a gate terminal configured to receive the third input Cin_n, a source terminal coupled to the drain terminal of the eighth PMOS transistor, and a drain terminal coupled to the fourth node J4. The eighth NMOS transistor N8 has a gate terminal configured to receive the third intermediate result GN2 of the first NOR logic circuit and a drain terminal coupled to the fourth node J4. The ninth NMOS transistor N9 has a gate terminal configured to receive the second intermediate result TN1 of the OR-AND-NOT logic circuit, and a drain terminal coupled to the fourth node J4. The tenth NMOS transistor N10 has a gate terminal configured to receive the third input Cin_N and a drain terminal coupled to a source terminal of the ninth NMOS transistor. A source terminal of each of the eighth NMOS transistor and the tenth NMOS transistor is coupled to the ground terminal VSS. The AND-OR-NOT logic circuit AOI21 is configured to generate a first output SUM at the fourth node J4.

The carry generation circuit NR2B includes an inverter INV and a second NOR logic circuit NR2'. The inverter INV is configured to receive the first intermediate result GN1 of the NAND logic circuit and generate a fourth intermediate result GN1$n$. The second NOR logic circuit NR2' is configured to receive the fourth intermediate result GN1$n$ of the inverter and the third intermediate result GN2 of the first NOR logic circuit and generate a second output Cout_n.

The inverter INV includes an eleventh PMOS transistor P11 and an eleventh NMOS transistor N11. A gate terminal of the eleventh PMOS transistor P11 is configured to receive the first intermediate result GN1 of the NAND logic circuit and a drain terminal of the eleventh PMOS transistor P11 is coupled to a fifth node J4. A source terminal of the eleventh PMOS transistor is coupled to the power supply terminal VDD. A gate terminal of the eleventh NMOS transistor N11 is configured to receive the first intermediate result GN1 of the NAND logic circuit and a drain terminal of the eleventh NMOS transistor N11 is coupled to the fifth node J5. A source terminal of the eleventh NMOS transistor is coupled to the ground terminal VSS. The inverter INV is configured to generate the fourth intermediate result GN1n at the fifth node.

The second NOR logic circuit NR2' includes a twelfth PMOS transistor P12, a thirteenth PMOS transistor P13, a twelfth NMOS transistor N12, and a thirteenth NMOS transistor N13. A gate terminal of the twelfth PMOS transistor P12 is configured to receive the fourth intermediate result GN1n of the inverter. A source terminal of the twelfth PMOS transistor is coupled to the power supply terminal VDD. The thirteenth PMOS transistor P13 has a gate terminal configured to receive the third intermediate result GN2 of the first NOR logic circuit, a source terminal coupled to a drain terminal of the twelfth PMOS transistor, and a drain terminal coupled to a sixth node J6. The twelfth NMOS transistor N12 has a gate terminal configured to receive the fourth intermediate result GN1N of the inverter and a drain terminal coupled to the sixth node J6. The thirteenth NMOS transistor N13 has a gate terminal configured to receive the output GN2 of the NOR logic circuit and a drain terminal coupled to the sixth node J6. A source terminal of each of the twelfth NMOS transistor and the thirteenth NMOS transistor is coupled to the ground terminal VSS. The second NOR logic circuit NR2' is configured to generate the second output Cout_n at the sixth node.

The input Cin and the output Cout of the full adder shown in FIG. 14 are both inverted, i.e. logical self-consistency is realized. Thus, an additional inverter does not need to be added, thereby reducing the use of transistors, and reducing the chip area.

Figure 15:
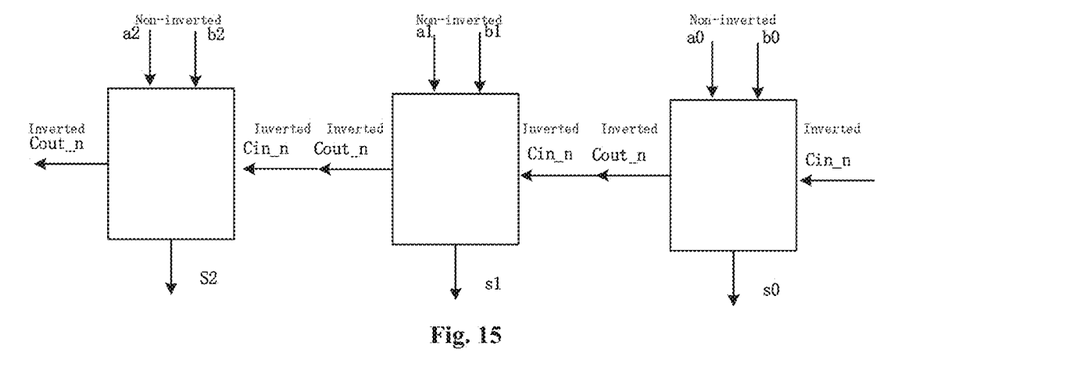
FIG. 15 shows a logic diagram of a ripple carry adder of an embodiment of the present disclosure.

FIG. 15 shows a logic diagram of a ripple carry adder of an embodiment of the present disclosure. The ripple carry adder includes a plurality of cascaded full adders of embodiments of the present disclosure. As shown in FIG. 15, the input carry Cin and the output carry Cout of each stage of full adder are inverted, i.e., logic self-consistency is realized. Because the output carry Cout of the previous full adder is the same as the input carry Cin of the current stage full adder in sign, an additional inverter is not needed, so that the use of transistors can be reduced, and the chip area can be reduced.

The full adder and ripple carry adder of the present disclosure have been described above in conjunction with specific embodiments. However, it should be understood that any feature of any one embodiment may be combined with and/or replaced with any other feature of any other embodiment.

Aspects of the present disclosure may be implemented in various electronic devices. Examples of electronic devices may include, but are not limited to, consumer electronics, components of consumer electronics, electronic test equipment, cellular communication infrastructure such as base stations, and the like. Examples of electronic devices may include, but are not limited to, mobile phones such as smart phones, wearable computing devices such as smart watches or headsets, phones, televisions, computer monitors, computers, modems, handheld computers, laptop computers, tablet computers, Personal Digital Assistants (PDAs), microwave ovens, refrigerators, in-vehicle electronic systems such as automotive electronic systems, stereos, DVD players, CD players, Digital music players such as MP3 players, radios, camcorders, cameras such as Digital cameras, portable memory chips, washing machines, dryers, washer/dryers, peripherals, clocks, and the like. Further, the electronic device may comprise an incomplete product.

Unless expressly requested otherwise in the context, throughout the description and the claims, the words "comprise", "include", "contain", "have", etc. are to be construed in an inclusive sense as opposed to an exclusive or exhaustive sense. That is, they mean "comprising but not limited to". As generally used herein, the term "coupled" refers to two or more elements that may be connected directly or through one or more intermediate elements. Likewise, as generally used herein, the term "connected" refers to two or more elements that may be connected directly or through one or more intermediate elements. Additionally, when used in this application, the words "herein", "above", "below", "hereinafter", "hereinbefore" and words of similar meaning shall refer to this application as a whole and not to any particular portion of this application.

Furthermore, unless expressly stated otherwise or otherwise understood in the context of such usage, conditional language, e.g., "may", "for example", "such as", etc., as used herein is generally intended to convey that certain embodiments include, while other embodiments do not include, certain features, elements, and/or states. Thus, such conditional language is not generally intended to imply that features, elements and/or states are in any way required for or included in one or more embodiments or performed in any particular embodiment.

Although certain embodiments have been described, these embodiments are presented only as examples and are not intended to limit the scope of the present disclosure. Indeed, the novel devices, methods, and systems described herein may be embodied in a variety of other forms. Furthermore, various omissions, substitutions and changes may be made to the form of the methods and systems described herein without departing from the spirit of the disclosure. For example, although the blocks are presented in a given arrangement, alternative embodiments may perform similar functions with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another or may be combined in various ways. All suitable combinations and subcombinations of the features of the present disclosure are intended to fall within the scope of the present disclosure.

What is claimed is:

1. An alternative data selector comprising:
a NOR logic circuit (NR2) configured to receive a selection signal (sel) and an inverted first input (a0_n) and generate an intermediate result (gn1); and
an AND-OR-NOT logic circuit (AOI21) configured to receive the selection signal (sel), a second input (a1) and the intermediate result (gn1) of the NOR logic circuit and generate an inverted output (XN).

2. The alternative data selector of claim 1, wherein
in the case where the selection signal (sel) is a logic 0, the inverted output (XN) is an inverted first input, and
in the case where the selection signal (sel) is a logic 1, the inverted output (XN) is an inverted second input.

3. The alternative data selector of claim 1, wherein the NOR logic circuit (NR2) comprises:

a first PMOS transistor whose gate terminal is configured to receive the selection signal (sel), wherein a source terminal of the first PMOS transistor is coupled to a power supply terminal;

a second PMOS transistor whose gate terminal is configured to receive the inverted first input (a0_n), whose source terminal is coupled to a drain terminal of the first PMOS transistor, and whose drain terminal is coupled to a first node;

a first NMOS transistor whose gate terminal is configured to receive the selection signal (sel) and whose drain terminal is coupled to the first node; and a second NMOS transistor whose gate terminal is configured to receive the inverted first input (a0_n) and whose drain terminal is coupled to the first node, wherein a source terminal of each of the first NMOS transistor and the second NMOS transistor is coupled to a ground terminal, wherein the NOR logic circuit (NR2) is configured to generate the intermediate result (gn1) at the first node.

4. The alternative data selector of claim 1, wherein the AND-OR-NOT logic circuit (AOI21) comprises:

a third PMOS transistor whose gate terminal is configured to receive the intermediate result (gn1) of the NOR logic circuit, wherein a source terminal of the third PMOS transistor is coupled to a power supply terminal;

a fourth PMOS transistor whose gate terminal is configured to receive the selection signal (sel), whose source terminal is coupled to a drain terminal of the third PMOS transistor, and whose drain terminal is coupled to a second node;

a fifth PMOS transistor whose gate terminal is configured to receive the second input (a1), whose source terminal is coupled to the drain terminal of the third PMOS transistor, and whose drain terminal is coupled to the second node;

a third NMOS transistor whose gate terminal is configured to receive the intermediate result (gn1) of the NOR logic circuit and whose drain terminal is coupled to the second node;

a fourth NMOS transistor whose gate terminal is configured to receive the selection signal (sel) and whose drain terminal is coupled to the second node; and a fifth NMOS transistor whose gate terminal is configured to receive the second input (a1) and whose drain terminal is coupled to a source terminal of the fourth NMOS transistor, wherein a source terminal of each of the third NMOS transistor and the fifth NMOS transistor is coupled to a ground terminal, wherein the AND-OR-NOT logic circuit (AOI21) is configured to generate the inverted output (XN) at the second node.

5. A full adder, comprising:

a NAND logic circuit (ND2) configured to receive a first input (A) and a second input (B) and generate a first intermediate result (GN1);

an OR-AND-NOT logic circuit (OAI21) configured to receive the first input (A), the second input (B) and the first intermediate result (GN1) of the NAND logic circuit and generate a second intermediate result (TN1);

a first NOR logic circuit (NR2) configured to receive the second intermediate result (TN1) of the OR-AND-NOT logic circuit (OAI21) and a third input (Cin_n) and generate a third intermediate result (GN2);

an AND-OR-NOT logic circuit (AOI21) configured to receive the second intermediate result (TN1) of the OR-AND-NOT logic circuit and the third input (Cin_n), and the third intermediate result (GN2) of the first NOR logic circuit, and generate a first output (SUM); and a carry generation circuit (NR2B) configured to receive the first intermediate result (GN1) of the NAND logic circuit and the third intermediate result (GN2) of the first NOR logic circuit, and generate a second output (Cout_n).

6. The full adder of claim 5, wherein in the case where the first input (A) is a non-inverted addend, the second input (B) is a non-inverted summand, the third input (Cin_n) is an inverted carry from a lower bit, the first output (SUM) is a non-inverted remainder and the second output is an inverted carry (Cout_n).

7. The full adder of claim 5, wherein the NAND logic circuit (ND2) comprises:

a first PMOS transistor whose gate terminal is configured to receive the first input (A) and whose drain terminal is coupled to a first node;

a second PMOS transistor whose gate terminal is configured to receive the second input (B) and whose drain terminal is coupled to the first node, wherein a source terminal of each of the first PMOS transistor and the second PMOS transistor is coupled to a power supply terminal;

a first NMOS transistor whose gate terminal is configured to receive the first input (A) and whose drain terminal is coupled to the first node; and a second NMOS transistor whose gate terminal is configured to receive the second input (B) and whose drain terminal is coupled to a source terminal of the first NMOS transistor, wherein a source terminal of the second NMOS transistor is coupled to a ground terminal, wherein the NAND logic circuit (ND2) is configured to generate the first intermediate result (GN1) at the first node.

8. The full adder of claim 5, wherein the OR-AND-NOT logic circuit (OAI21) comprises:

a third PMOS transistor whose gate terminal is configured to receive the first intermediate result (GN1) of the NAND logic circuit and whose drain terminal is coupled to a second node;

a fourth PMOS transistor whose gate terminal is configured to receive the first input (A), wherein a source terminal of each of the third PMOS transistor and the fourth PMOS transistor is coupled to a power supply terminal;

a fifth PMOS transistor whose gate terminal is configured to receive the second input (B), whose source terminal is coupled to a drain terminal of the fourth PMOS transistor, and whose drain terminal is coupled to the second node;

a third NMOS transistor whose gate terminal is configured to receive the first intermediate result (GN1) of the NAND logic circuit, and whose drain terminal is coupled to the second node;

a fourth NMOS transistor whose gate terminal is configured to receive the first input (A) and whose drain terminal is coupled to a source terminal of the third NMOS transistor; and a fifth NMOS transistor whose gate terminal is configured to receive the second input (B) and whose drain terminal is coupled to the source terminal of the third NMOS transistor, wherein a source terminal of each of the fourth NMOS transistor and the fifth NMOS transistor is coupled to a ground terminal, wherein the OR-AND-NOT logic circuit (OAI21) is configured to generate the second intermediate result (TN1) at the second node.

9. The full adder of claim 5, wherein the first NOR logic circuit (NR2) comprises:
a sixth PMOS transistor whose gate terminal is configured to receive the second intermediate result (TN1) of the OR-AND-NOT logic circuit (OAI21), wherein a source terminal of the sixth PMOS transistor is coupled to a power supply terminal;
a seventh PMOS transistor whose gate terminal is configured to receive the third input (Cin_n), whose source terminal is coupled to a drain terminal of the sixth PMOS transistor, and whose drain terminal is coupled to a third node;
a sixth NMOS transistor whose gate terminal is configured to receive the second intermediate result (TN1) of the OR-AND-NOT logic circuit (OAI21) and whose drain terminal is coupled to the third node; and
a seventh NMOS transistor whose gate terminal is configured to receive the third input (Cin_n) and whose drain terminal is coupled to the third node, wherein a source terminal of each of the sixth NMOS transistor and the seventh NMOS transistor is coupled to a ground terminal,
wherein the first NOR logic circuit (NR2) is configured to generate the third intermediate result (GN2) at the third node.

10. The full adder of claim 5, wherein the AND-OR-NOT logic circuit (AOI21) comprises:
an eighth PMOS transistor whose gate terminal is configured to receive the third intermediate result (GN2) of the first NOR logic circuit, wherein a source terminal of the eighth PMOS transistor is coupled to a power supply terminal;
a ninth PMOS transistor whose gate terminal is configured to receive the second intermediate result (TN1) of the OR-AND-NOT logic circuit, whose source terminal is coupled to a drain terminal of the eighth PMOS transistor, and whose drain terminal is coupled to a fourth node;
a tenth PMOS transistor whose gate terminal is configured to receive the third input (Cin_n), whose source terminal is coupled to the drain terminal of the eighth PMOS transistor, and whose drain terminal is coupled to the fourth node;
an eighth NMOS transistor whose gate terminal is configured to receive the third intermediate result (GN2) of the first NOR logic circuit and whose drain terminal is coupled to the fourth node;
a ninth NMOS transistor whose gate terminal is configured to receive the second intermediate result (TN1) of the OR-AND-NOT logic circuit, and whose drain terminal is coupled to the fourth node; and
a tenth NMOS transistor whose gate terminal is configured to receive the third input (Cin_n) and whose drain terminal is coupled to a source terminal of the ninth NMOS transistor, wherein a source terminal of each of the eighth NMOS transistor and the tenth NMOS transistor is coupled to a ground terminal,
wherein the AND-OR-NOT logic circuit (AOI21) is configured to generate the first output (SUM) at the fourth node.

11. The full adder of claim 5, wherein the carry generation circuit (NR2B) comprises an inverter (INV) configured to receive the first intermediate result (GN1) of the NAND logic circuit and generate a fourth intermediate result (GN1n) and a second NOR logic circuit (NR2') configured to receive the fourth intermediate result (GN1n) of the inverter and the third intermediate result (GN2) of the first NOR logic circuit and generate the second output (Cout_n).

12. The full adder of claim 11, wherein the inverter (INV) comprises:
an eleventh PMOS transistor whose gate terminal is configured to receive the first intermediate result (GN1) of the NAND logic circuit and whose drain terminal is coupled to a fifth node, wherein a source terminal of the eleventh PMOS transistor is coupled to a power supply terminal; and
an eleventh NMOS transistor whose gate terminal is configured to receive the first intermediate result (GN1) of the NAND logic circuit and whose drain terminal is coupled to the fifth node, wherein a source terminal of the eleventh NMOS transistor is coupled to a ground terminal,
wherein the inverter (INV) is configured to generate the fourth intermediate result (GN1n) at the fifth node.

13. The full adder as claimed in claim 11, wherein the second NOR logic circuit (NR 2') comprises:
a twelfth PMOS transistor whose gate terminal is configured to receive the fourth intermediate result (GN1n) of the inverter, wherein a source terminal of the twelfth PMOS transistor is coupled to a power supply terminal;
a thirteenth PMOS transistor whose gate terminal is configured to receive the third intermediate result (GN2) of the first NOR logic circuit, whose source terminal is coupled to a drain terminal of the twelfth PMOS transistor, and whose drain terminal is coupled to a sixth node;
a twelfth NMOS transistor whose gate terminal is configured to receive the fourth intermediate result (GN1n) of the inverter and whose drain terminal is coupled to the sixth node; and
a thirteenth NMOS transistor whose gate terminal is configured to receive the output (GN2) of the NOR logic circuit and whose drain terminal is coupled to the sixth node, wherein a source terminal of each of the twelfth NMOS transistor and the thirteenth NMOS transistor is coupled to a ground terminal,
wherein the second NOR logic circuit (NR2') is configured to generate the second output (Cout_n) at the sixth node.

14. A ripple carry adder comprising a plurality of cascaded full adders as claimed in claim 5.

* * * * *